United States Patent
Huang et al.

(10) Patent No.: US 8,299,596 B2
(45) Date of Patent: Oct. 30, 2012

(54) INTEGRATED CIRCUIT PACKAGING SYSTEM WITH BUMP CONDUCTORS AND METHOD OF MANUFACTURE THEREOF

(75) Inventors: Rui Huang, Singapore (SG); Seng Guan Chow, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 68 days.

(21) Appl. No.: 12/968,257

(22) Filed: Dec. 14, 2010

(65) Prior Publication Data
US 2012/0146241 A1 Jun. 14, 2012

(51) Int. Cl.
*H01L 23/02* (2006.01)
(52) U.S. Cl. .......... 257/686; 257/E25.023; 257/685; 257/777; 438/108; 438/612
(58) Field of Classification Search .......... 257/E23.069, 257/E25.023, 685, 686, 737, 738, 747, 775–780, 257/691; 438/117, 122, 612, 613, 107–109, 438/638
See application file for complete search history.

(56) References Cited

U.S. PATENT DOCUMENTS

| | | | |
|---|---|---|---|
| 5,940,729 A * | 8/1999 | Downes et al. | 438/613 |
| 6,121,689 A * | 9/2000 | Capote et al. | 257/783 |
| 6,271,109 B1 * | 8/2001 | Weygan et al. | 438/612 |
| 6,392,143 B1 * | 5/2002 | Koshio | 174/528 |
| 6,396,159 B1 * | 5/2002 | Shoji | 257/788 |
| 6,905,911 B2 * | 6/2005 | Hamaguchi et al. | 438/107 |
| 7,052,935 B2 | 5/2006 | Pai et al. | |
| 7,091,619 B2 | 8/2006 | Aoyagi | |
| 7,633,157 B2 * | 12/2009 | Jiang et al. | 257/724 |
| 7,635,912 B2 * | 12/2009 | Ejima | 257/678 |
| 7,863,101 B2 * | 1/2011 | Suzuki et al. | 438/109 |
| 8,076,762 B2 * | 12/2011 | Chandrasekaran et al. | 257/673 |
| 2004/0227236 A1 * | 11/2004 | Sawamoto | 257/734 |
| 2004/0238954 A1 * | 12/2004 | Miyaji et al. | 257/737 |
| 2007/0164445 A1 * | 7/2007 | Ejima | 257/777 |
| 2008/0143379 A1 | 6/2008 | Norman | |
| 2009/0039490 A1 * | 2/2009 | Fan | 257/686 |
| 2009/0102049 A1 * | 4/2009 | Murata et al. | 257/737 |

* cited by examiner

*Primary Examiner* — Chris Chu
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing a base substrate having a component side; mounting a base device having a base circuit connector directly on the component side; attaching conformal interconnects, having the same pre-deformation height from the component side, directly on the component side and offset from the base device; and attaching a stack substrate having stack interconnects directly on the conformal interconnects, portions of the stack interconnects covered by the conformal interconnects having different deformation heights from the component side.

20 Claims, 5 Drawing Sheets

INTEGRATED CIRCUIT PACKAGING SYSTEM WITH BUMP CONDUCTORS AND METHOD OF MANUFACTURE THEREOF

TECHNICAL FIELD

The present invention relates generally to an integrated circuit packaging system, and more particularly to a system with bump conductors.

BACKGROUND ART

Products must be capable of competing in world markets and attracting many consumers or buyers. Market growth for high density and high output/input integrated circuit packages has resulted in a trend for electronic products that are lightweight, smaller in size, multi-functional, and capable of ever increasing higher speeds.

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages with more and more package connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections can be spaced apart from one another. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate having a component side; mounting a base device having a base circuit connector directly on the component side; attaching conformal interconnects, having the same pre-deformation height from the component side, directly on the component side and offset from the base device; and attaching a stack substrate having stack interconnects directly on the conformal interconnects, portions of the stack interconnects covered by the conformal interconnects having different deformation heights from the component side.

The present invention provides an integrated circuit packaging system, including: a base substrate having a component side; a base device having a base circuit connector mounted directly on the component side; conformal interconnects attached directly on the component side and offset from the base device; and a stack substrate having stack interconnects directly on the conformal interconnects, portions of the stack interconnects covered by the conformal interconnects having different deformation heights from the component side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
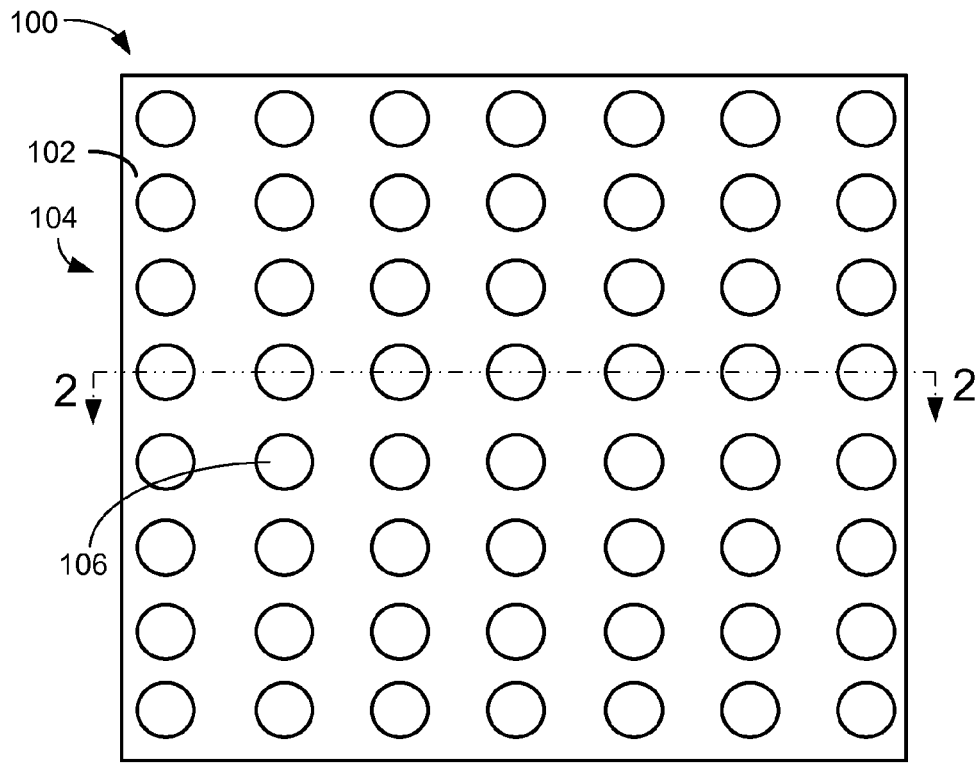
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. Shown is a base side 102 of a base substrate 104 with system interconnects 106 on the base side 102.

The base substrate 104 can include a substrate, an interposer, a circuit board, or a laminate with base conductors. The base conductors are used to provide connectivity to areas on the base side 102, to areas on a side of the base substrate 104 opposite the base side 102, or between areas on the base side 102 and on the side of the base substrate 104 opposite the base side 102.

The system interconnects 106 can include conductive balls, bumps, pins, or pillars. The system interconnects 106 are attached to the base conductors on the base side 102 to provide connectivity the integrated circuit packaging system 100 and a next level of integration (not shown) that can include a printed circuit board, an integrated circuit module, or an electronic assembly.

Figure 2:
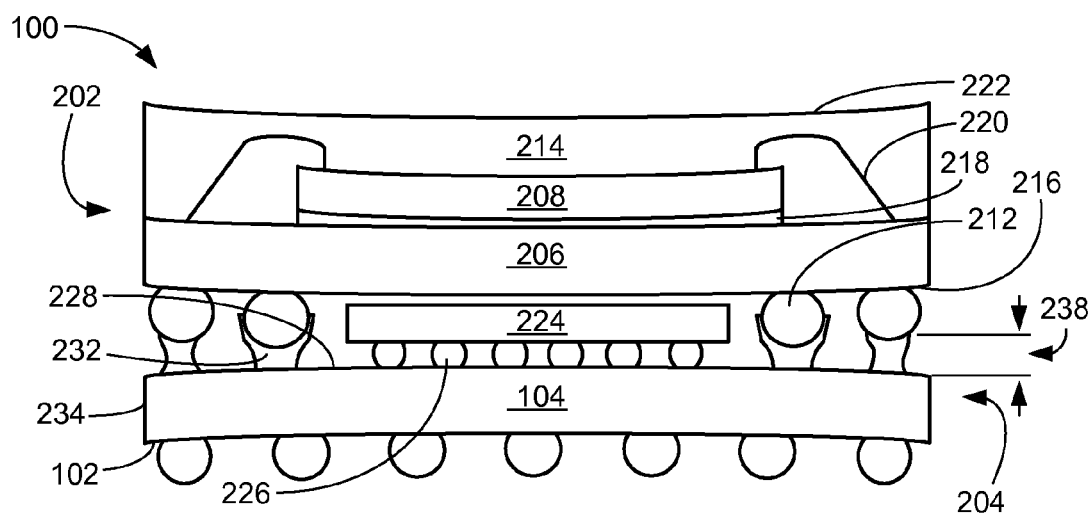
FIG. 2 is a cross-sectional view of FIG. 1 taken along a line 2-2 of FIG. 1.

Referring now to FIG. 2, therein is shown a cross-sectional view of FIG. 1 taken along a line 2-2 of FIG. 1. The integrated circuit packaging system 100 includes a stack package 202 over and connected or attached to a base package 204.

The stack package 202 includes a stack substrate 206, a stack device 208, stack interconnects 212, and a stack encapsulation 214. The stack interconnects 212 can include conductive balls, bumps, pins, or pillars.

The stack interconnects 212 are attached to stack conductors on a stack side 216 of the stack substrate 206. The stack conductors are used to provide connectivity to areas on the stack side 216, to areas on a side of the stack substrate 206 opposite the stack side 216, or between areas on the stack side 216 and on the side of the stack substrate 206 opposite the stack side 216.

The stack device 208 can include a wire bond chip, an integrated circuit device, or a flip chip. The stack device 208 can be mounted on a side of the stack substrate 206 opposite the stack side 216 using a stack attachment layer 218. The stack attachment layer 218 can include an adhesive layer, a stacking adhesive, or a combination thereof.

For illustrative purposes, the side of the stack substrate 206 opposite the stack side 216 is shown having a concave shaped surface. It is understood that the side of the stack substrate 206 opposite the stack side 216 can have shaped surfaces, flat surfaces, or combinations thereof. The side of the stack substrate 206 opposite the stack side 216 can have a convex shaped surface, as an example. The side of the stack substrate 206 opposite the stack side 216 can have a section having a concave shape abutted to a section having a convex shape, as a further example.

Stack circuit connectors 220 are attached to circuitry of the stack device 208 and the stack conductors on the side of the stack substrate 206 opposite the stack side 216 to provide connectivity between the stack substrate 206 and the stack device 208. The stack circuit connectors 220 can include conductive wires, balls, bumps, leads, or any combination thereof.

The stack encapsulation 214 is a covering to protect and hermetically seal the contents of the integrated circuit packaging system 100. The stack encapsulation 214 covers the side of the stack substrate 206 opposite the stack side 216, the stack device 208, and the stack circuit connectors 220.

The stack encapsulation 214 can include an encapsulation curved side 222 facing away from the stack substrate 206. For illustrative purposes, the encapsulation curved side 222 is shown having a concave shaped surface. It is understood that the encapsulation curved side 222 can have shaped surfaces, flat surfaces, or combinations thereof. The encapsulation curved side 222 can have a convex shaped surface, as an example. The encapsulation curved side 222 can have a section having a concave shape abutted to a section having a convex shape, as a further example.

For illustrative purposes, the stack side 216 is shown having a convex shaped surface. It is understood that the stack side 216 can have shaped surfaces, flat surfaces, or combinations thereof. The stack side 216 can have a concave shaped surface, as an example. The stack side 216 can have a section having a concave shape abutted to a section having a convex shape, as a further example.

The base package 204 includes a base device 224 having base circuit connectors 226 and conformal interconnects 232. The base device 224 can include a flip chip, an integrated circuit device, or a wire bond chip. The base device 224 can be mounted over a component side 228 of the base substrate 104 opposite the base side 102.

The base circuit connectors 226 can be connected or attached to the base device 224 and to the base conductors on the component side 228 to provide connectivity between circuitry of the base device 224 and the base substrate 104. The base circuit connectors 226 can include conductive balls, bumps, leads, wires, or any combination thereof.

For illustrative purposes, the base circuit connectors 226 are shown partially exposed between the base device 224 and the component side 228. It is understood that the base circuit connectors 226 or an area between the base device 224 and the component side can be covered or enclosed by a non-electrical conductive material to provide additional structural protection, thermal stability, improved thermal dissipation, or shielding. For example, the area between the base device 224 and the component side 228 can be filled with an underfill material such as an epoxy based material, an encapsulant material, a gel, or a thermally conductive material.

For illustrative purposes, the base side 102 is shown having a concave shaped surface. It is understood that the base side 102 can include shaped surfaces, flat surfaces, or combinations thereof. The base side 102 can include a convex shaped surface, as an example. The base side 102 can include a section having a concave shape abutted to a section having a planar shape, as a further example.

Also for illustrative purposes, the component side 228 is shown having a convex shaped surface. It is understood that the component side 228 can include shaped surfaces, planar surfaces, or combinations thereof. The component side 228 can include a concave shaped surface, as an example. The component side 228 can include a surface shaped the same as or different from a surface shape of the base side 102.

The conformal interconnects 232 can be formed of a material that is electrically conductive, pliable, elastic, and conforming to different shapes. The conformal interconnects 232 can include an electrical conductive adhesive (ECA) material or a material having properties similar to ECA. The conformal interconnects 232 are attached or connected to the base conductors exposed on the component side 228 using a curing process to create a fully polymerized resin.

For illustrative purposes, the conformal interconnects 232 is shown between the base device 224 and the peripheral sides 234. It is understood that the conformal interconnects 232 can be attached or connected to any of the base conductors exposed and offset from the base device 224 on the component side 228. For example, the conformal interconnects 232 can be attached or connected to the component side 228 having an offset towards one end of the base substrate 104 and the base device 224 can have an offset towards an opposite end of the base substrate 104, away from the conformal interconnects 232.

The stack interconnects 212 of the stack package 202 can be aligned over the conformal interconnects 232 of the base package 204. The stack interconnects 212 are attached directly on the conformal interconnects 232. A thermal compression bonding process can be used to adhere or abut the stack interconnects 212 and the conformal interconnects 232 directly together without a reflow process or reflow processing temperatures. The conformal interconnects 232 cover a portion or portions of the stack interconnects 212.

The thermal compression bonding process can result in the conformal interconnects 232 having a horizontal cross-sectional shape formed of straight segments, curved segments, or a combination thereof. The horizontal cross-sectional shape is defined as a shape of one of the conformal interconnects 232 intersecting a plane perpendicular to a vertical central axis of the one of the conformal interconnects 232. Exemplary shapes of the horizontal cross-sectional shapes include a star shape, a convex polygon shape, an equilateral polygon shape, an equiangular polygon shape, a trapezoidal shape, a cyclic quadrilateral shape, a regular polygon shape, or an annulus shape.

The thermal compression bonding process can also result in the conformal interconnects 232 having a vertical cross-sectional shape formed of straight segments, curved segments, or a combination thereof. The vertical cross-sectional shape is defined as a shape of one of the conformal interconnects 232 intersecting a plane having a vertical central axis of the one of the conformal interconnects 232. Exemplary shapes of the vertical cross-sectional shape include a biconcave shape, a plano-concave shape, a biconvex shape, a plano-convex shape, a conical shape, an elliptical shape, or a rectangular shape.

For illustrative purposes, the conformal interconnects 232 is shown covering a portion or portions of the stack interconnects 212. The conformal interconnects 232 can cover any combination of portions of the stack interconnects 212. For example, the conformal interconnects 232 can completely enclose all exposed portions of the stack interconnects 212. In another example, the conformal interconnects 232 can enclose the stack interconnects 212 with a surface area of the stack interconnects 212 directly on the base conductors attached to the conformal interconnects 232.

A deformation height 238 is defined as a height of the conformal interconnects 232 measured perpendicularly from the component side 228 to a point on the conformal interconnects 232 furthest above the component side 228. The deformation height 238 of each of the conformal interconnects 232 can be different from one another.

It has been discovered that the conformal interconnects 232 conforming to the surface of the stack interconnects 212 prevents shorting of the stack interconnects 212 to one another. The conformal interconnects 232 adhere and cover portions of the conformal interconnects 232 to prevent lateral movement that could result in electrical shorting of the stack interconnects 212.

It has been unexpectedly found that the distribution, volume and shape of the stack interconnects 212 provides additional control of the volume & shapes of the conformal interconnects 232 to further prevent shorting, enable fine pitch interconnections, or provide package profiles lower than typical package on packages with rigid solder/conductive bumps.

It has been unexpectedly found that the conformal interconnects 232 connecting the stack package 202 with the base package 204 eliminates problems attributed to coefficient of thermal expansion mismatches (CTE mismatches) or solder joint reliability. The conformability and pliability of the conformal interconnects 232 is found to accommodate or adjust with thermal movements or eliminate solder joint stress.

It has been unexpectedly observed that the opens or shorts attributed to misalignment between the stack interconnects 212 and the conformal interconnects 232 are eliminated using the conformal interconnects 232 formed from polymide-siloxane thermoplastics.

Figure 3:
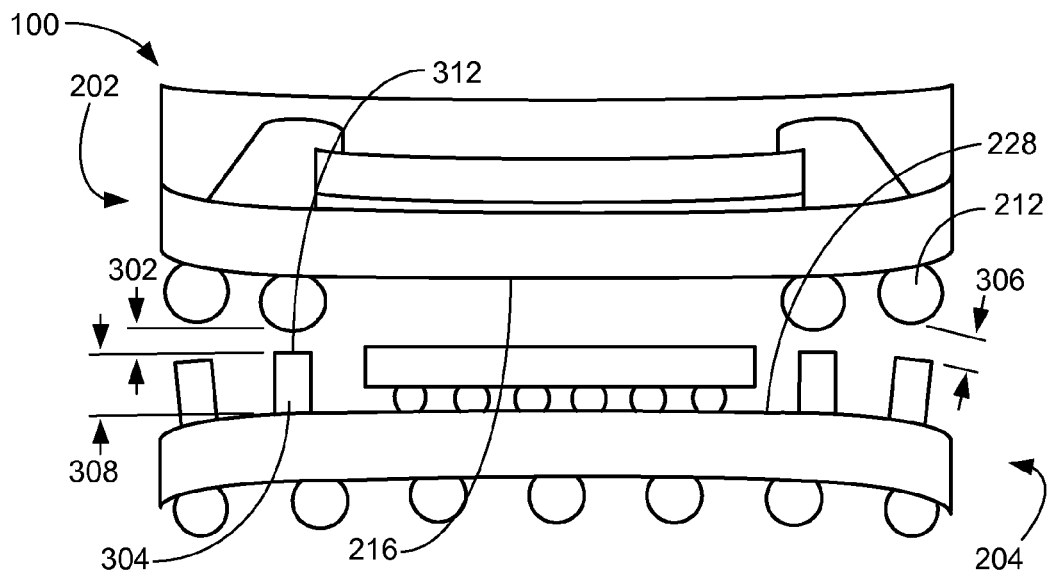
FIG. 3 is the cross-sectional view of FIG. 2 in an assembly alignment phase of manufacture.

Referring now to FIG. 3, therein is shown the cross-sectional view of FIG. 2 in an assembly alignment phase of manufacture. The stack package 202 is positioned over the base package 204 during the assembly alignment phase of manufacture before connection or attachment to the base package 204. The stack interconnects 212 are each individually vertically centered over non-deformed conformal interconnects 304.

A minimum separation distance 302 is defined as a smallest magnitude distance between closets points on the stack interconnects 212 and on the non-deformed conformal interconnects 304 under the stack interconnects 212. A maximum separation distance 306 is defined as a largest magnitude distance between closets points on the stack interconnects 212 and on the non-deformed conformal interconnects 304 under the stack interconnects 212.

A pre-deformation height 308 is defined as a height of the non-deformed conformal interconnects 304 measured perpendicularly from the component side 228 to a top surface 312 of the non-deformed conformal interconnects 304 during the assembly alignment phase. The pre-deformation height 308 of each of the non-deformed conformal interconnects 304 are the same. The minimum separation distance 302 is less than the maximum separation distance 306 as a result of a differential in deformation between the stack package 202 and the base package 204 prior to integration of the stack package 202 and the base package 204.

It has been discovered that the non-deformed conformal interconnects 304 having the pre-deformation height 308 greater than one hundred fifty microns accommodates packages with a variety of shapes and warpage.

It has also been discovered that forming the non-deformed conformal interconnects 304 with the pre-deformation height 308 having equal lengths eliminates the need for customized package designs or package characterizations to determine specific lengths for each of the lengths of the non-deformed conformal interconnects 304, reduced development cycles, and simplified manufacturing processes.

It has been unexpectedly observed that the difference in magnitude between the minimum separation distance 302 and the maximum separation distance 306 is proportionally related to a contact surface area containing the intersection of the stack interconnects 212 and the conformal interconnects 232 of FIG. 2 from the thermal compression bonding process.

Figure 4:
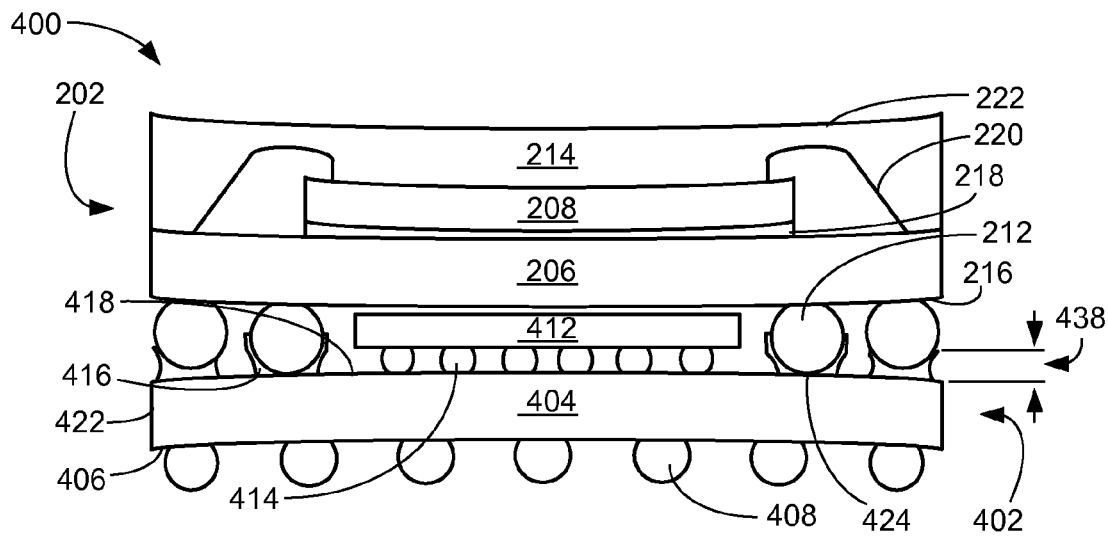
FIG. 4 is a cross-sectional view of an integrated circuit packaging system in a second embodiment of the present invention.

Referring now to FIG. 4, therein is shown a cross-sectional view of an integrated circuit packaging system 400 in a second embodiment of the present invention. The integrated circuit packaging system 400 includes the stack package 202 over and connected or attached to a base package 402.

The stack package 202 includes the stack substrate 206, the stack device 208, the stack interconnects 212, and the stack encapsulation 214. The stack interconnects 212 are attached to the stack conductors on the stack side 216 of the stack substrate 206.

The stack device 208 can be mounted on the side of the stack substrate 206 opposite the stack side 216 using the stack attachment layer 218. The stack circuit connectors 220 are attached to circuitry of the stack device 208 and the stack conductors on the side of the stack substrate 206 opposite the stack side 216.

The stack encapsulation 214 covers the side of the stack substrate 206 opposite the stack side 216, the stack device 208, and the stack circuit connectors 220. The stack encapsulation 214 can include the encapsulation curved side 222 facing away from the stack substrate 206.

The base package 402 includes a base substrate 404 with a base side 406 and system interconnects 408 on the base side 406. The base substrate 404 can include a substrate, an interposer, a circuit board, or a laminate with base conductors. The base conductors are used to provide connectivity between, on, or within the base side 406 and sides of the base substrate 404.

The system interconnects 408 can include conductive balls, bumps, pins, or pillars. The system interconnects 408 are attached to the base conductors on the base side 406 to provide connectivity the integrated circuit packaging system 400 and a next level of integration (not shown) that can include a printed circuit board, an integrated circuit module, or an electronic assembly.

The base package 402 also includes a base device 412 having base circuit connectors 414 and conformal interconnects 416 or an electrical adhesive interconnect (ECA interconnect). The base device 412 can include a flip chip, an integrated circuit device, or a wire bond chip. The base device 412 can be mounted over a component side 418 of the base substrate 404 opposite the base side 406.

The base circuit connectors 414 can be connected or attached to the base device 412 and to the base conductors on the component side 418 to provide connectivity between circuitry of the base device 412 and the base substrate 404. The base circuit connectors 414 can include conductive balls, bumps, leads, wires, or any combination thereof.

For illustrative purposes, the base circuit connectors 414 are shown partially exposed between the base device 412 and the component side 418. It is understood that the base circuit connectors 414 or an area between the base device 412 and the component side can be covered or enclosed by a non-electrical conductive material to provide additional structural protection, thermal stability, improved thermal dissipation, or shielding. For example, the area between the base device 412 and the component side 418 can be filled with an underfill material that can include an epoxy based material, an encapsulant material, a gel, or a thermally conductive material.

For illustrative purposes, the base side 406 is shown having a concave shaped surface. It is understood that the base side 406 can include shaped surfaces, flat surfaces, or combinations thereof. The base side 406 can include a convex shaped surface, as an example. The base side 406 can include a section having a concave shape abutted to a section having a convex shape, as a further example.

Also for illustrative purposes, the component side 418 is shown having a convex shaped surface. It is understood that the component side 418 can include shaped surfaces, planar surfaces, or combinations thereof. The component side 418 can include a concave shaped surface, as an example. The component side 418 can include a surface shaped the same as or different from a surface shape of the base side 406.

The conformal interconnects 416 can be formed of a material that is electrically conductive, pliable, elastic, and conforming to different shapes. The conformal interconnects 416 can include an electrical conductive adhesive (ECA) material or a material having properties similar to ECA. The conformal interconnects 416 are attached or connected to the base conductors exposed on the component side 418 using a curing process to create a fully polymerized resin.

For illustrative purposes, the conformal interconnects 416 is shown between the base device 412 and the peripheral sides 422. It is understood that the conformal interconnects 416 can be attached or connected to any of the base conductors exposed and offset from the base device 412 on the component side 418. For example, the conformal interconnects 416 can be attached or connected to the component side 418 having an offset towards one end of the base substrate 404 and the base device 412 can have an offset towards an opposite end of the base substrate 404, away from the conformal interconnects 416.

The stack interconnects 212 of the stack package 202 can be aligned over the conformal interconnects 416 of the base package 402. The stack interconnects 212 are attached directly on the conformal interconnects 416. A thermal compression bonding process can be used to adhere or abut the stack interconnects 212 and the conformal interconnects 416 directly together without a reflow process or reflow processing temperatures.

The thermal compression bonding process can result in the conformal interconnects 416 having a horizontal cross-sectional shape formed of straight segments, curved segments, or a combination thereof. The horizontal cross-sectional shape is defined as a shape of one of the conformal interconnects 416 intersecting a plane perpendicular to a central axis of the one of the conformal interconnects 416. Exemplary shapes of the horizontal cross-sectional shapes include a star shape, a convex polygon shape, an equilateral polygon shape, an equiangular polygon shape, a trapezoidal shape, a cyclic quadrilateral shape, a regular polygon shape, or an annulus shape.

The thermal compression bonding process can also result in the conformal interconnects 416 having a vertical cross-sectional shape formed of straight segments, curved segments, or a combination thereof. The vertical cross-sectional shape is defined as a shape of one of the conformal interconnects 416 intersecting a plane having a central axis of the one of the conformal interconnects 416. Exemplary shapes of the vertical cross-sectional shape include a biconcave shape, a plano-concave shape, a biconvex shape, a plano-convex shape, a conical shape, an elliptical shape, or a rectangular shape.

The conformal interconnects 416 cover a portion or portions of the stack interconnects 212. The base conductors on the component side 418 directly attached to some of the conformal interconnects 416 can also be abutted or in direct contact with a contact surface area 424 of the stack interconnects 212.

For illustrative purposes, the conformal interconnects 416 is shown covering a portions of the stack interconnects 212. For example, the conformal interconnects 416 can completely all exposed portions of the stack interconnects 212.

A deformation height 438 is defined as a height of the conformal interconnects 416 measured perpendicularly from the component side 418 to a point on the conformal interconnects 416 furthest above the component side 418. The deformation height 438 of each of the conformal interconnects 416 can be different from one another.

Figure 5:
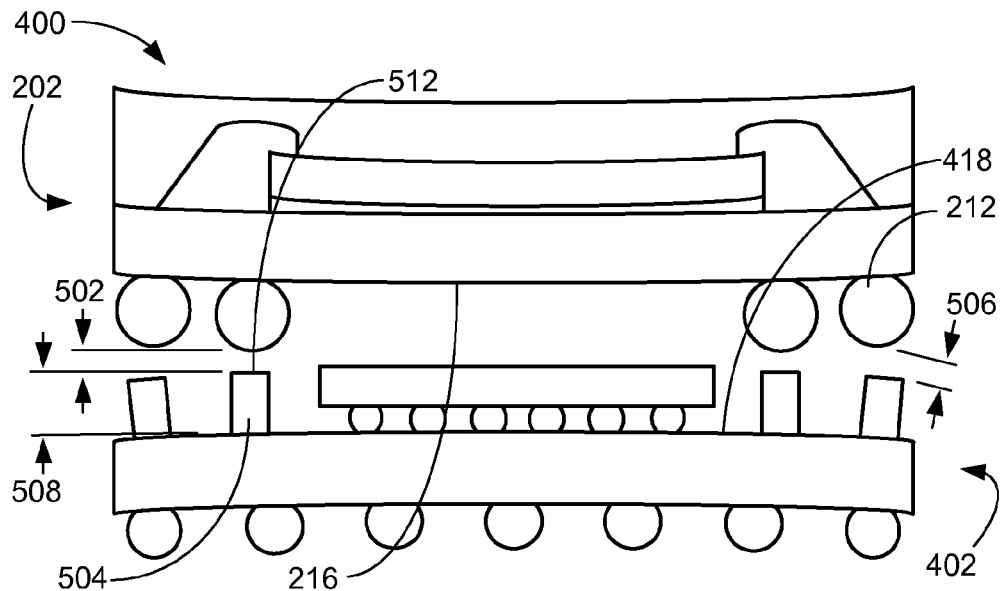
FIG. 5 is the cross-sectional view of FIG. 4 in an assembly alignment phase of manufacture.

Referring now to FIG. 5, therein is shown the cross-sectional view of FIG. 4 in an assembly alignment phase of manufacture. The stack package 202 is positioned over the base package 402 during the assembly alignment phase of manufacture. The stack interconnects 212 are each individually vertically centered over the non-deformed conformal interconnects 504.

A minimum separation distance 502 is defined as a smallest magnitude distance between closets points on the stack interconnects 212 and on the non-deformed conformal interconnects 504 under the stack interconnects 212. A maximum separation distance 506 is defined as a largest magnitude distance between closets points on the stack interconnects 212 and on the non-deformed conformal interconnects 504 under the stack interconnects 212.

A pre-deformation height 508 is defined as a height of the non-deformed conformal interconnects 504 measured perpendicularly from the component side 418 to a top surface 512 of the non-deformed conformal interconnects 504 during the assembly alignment phase. The pre-deformation height 508 of each of the non-deformed conformal interconnects 504 are the same.

The minimum separation distance 502 is less than the maximum separation distance 506 as a result of a differential in deformation between the stack package 202 and the base package 402 prior to integration of the stack package 202 and the base package 402.

It has been discovered that the non-deformed conformal interconnects 504 having the pre-deformation height 508 greater than one hundred fifty microns accommodates packages with a variety of shapes and warpage.

It has also been discovered that forming the non-deformed conformal interconnects 304 with the pre-deformation height 508 having equal lengths eliminates the need for customized package designs or package characterizations to determine specific lengths for each of the lengths of the non-deformed conformal interconnects 504, reduced development cycles, and simplified manufacturing processes.

It has been unexpectedly observed that the difference in magnitude between the minimum separation distance 502 and the maximum separation distance 506 is proportionally related to a contact surface area containing the intersection of the stack interconnects 212 and the conformal interconnects 416 of FIG. 4 from the thermal compression bonding process.

Figure 6:
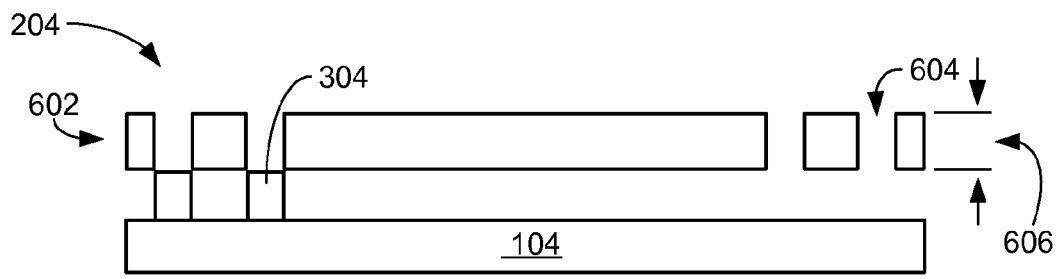
FIG. 6 is a cross-sectional view of the base package of FIG. 2 in an adhesive application phase of manufacture.

Referring now to FIG. 6, therein is shown a cross-sectional view of the base package 204 of FIG. 2 in an adhesive application phase of manufacture. The non-deformed conformal interconnects 304 used to form the conformal interconnects 232 of FIG. 2 can be applied directly on the base substrate 104 during the adhesive application phase. The adhesive application phase can include a stencil 602 or screen with stencil openings 604 of the stencil 602 positioned over the base conductors exposed on the base substrate 104 using a fixture (not shown).

A stencil thickness 606 can be equal to the pre-deformation height 508 of FIG. 5 to form the non-deformed conformal interconnects 304 with the same heights. The material of the non-deformed conformal interconnects 304 can be pressed, screen-printed with a squeegee, or dispensed directly on the base conductors. The stencil 602 can be removed and the material of the non-deformed conformal interconnects 304 left on the base substrate 104 in preparation for the die attach phase of manufacture.

It has been discovered that the non-deformed conformal interconnects 304 having a standoff height of one hundred fifty microns ensures contact between the stack interconnects 212 of FIG. 2 and the non-deformed conformal interconnects 304. The contact between the stack interconnects 212 and the non-deformed conformal interconnects 304 is ensured because vertical variation caused by warpage could be complemented by standoff height of the non-deformed conformal interconnects 304.

It has been further discovered that the non-deformed conformal interconnects 304 processed with the post curing temperature of one hundred seventy five degrees centigrade eliminates occurrences of warpage of the base package 204.

Figure 7:
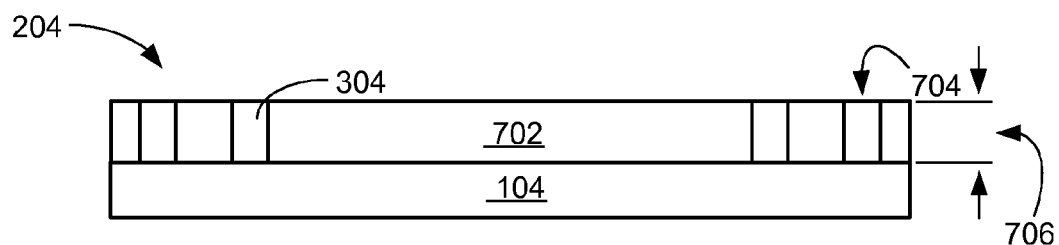
FIG. 7 is a cross-sectional view of the base package of FIG. 2 in alternative adhesive application phase of manufacture.

Referring now to FIG. 7, therein is shown a cross-sectional view of the base package 204 of FIG. 2 in alternative adhesive application phase of manufacture. The non-deformed conformal interconnects 304 used to form the conformal interconnects 232 of FIG. 2 can be applied directly on the base substrate 104 during the alternative adhesive application phase. The adhesive application phase can include a photo resist layer 702 or mask layer applied to the base substrate 104. Resist openings 704 formed in the photo resist layer 702 can be used to expose the base conductors on the base substrate 104.

The resist thickness 706 of the photo resist layer 702 can be equal to the pre-deformation height 508 of FIG. 5 to form the non-deformed conformal interconnects 304 with the same heights. The material of the non-deformed conformal interconnects 304 applied through the resist openings 704 and directly on to the base conductors exposed on the base substrate 104. The photo resist layer 702 can be removed from the base substrate 104 and the material of the non-deformed conformal interconnects 304 left on the base substrate 104 in preparation for the die attach phase of manufacture.

It has been discovered that the non-deformed conformal interconnects 304 having a standoff height of one hundred fifty microns ensures contact between the stack interconnects 212 of FIG. 2 and the non-deformed conformal interconnects 304. The contact between the stack interconnects 212 and the non-deformed conformal interconnects 304 is ensured because vertical variation caused by warpage could be complemented by standoff height of the non-deformed conformal interconnects 304.

It has been further discovered that the non-deformed conformal interconnects 304 processed with the post curing temperature of one hundred seventy five degrees centigrade eliminates occurrences of warpage of the base package 204.

Figure 8:
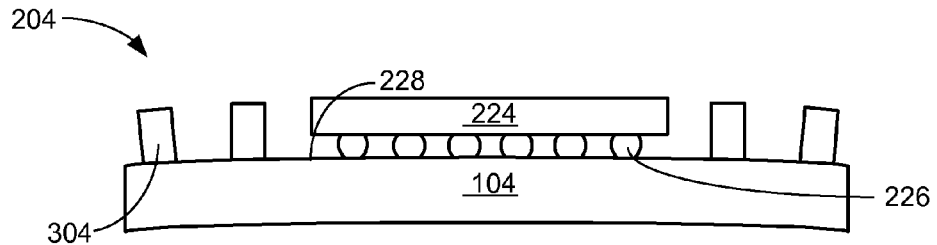
FIG. 8 is a cross-sectional view of the base package of FIG. 2 in a die attach phase of manufacture.

Referring now to FIG. 8, therein is shown a cross-sectional view of the base package 204 of FIG. 2 in a die attach phase of manufacture. The base device 224 can be mounted and connected or attached to the base conductors exposed between the non-deformed conformal interconnects 304 on the base substrate 104. The base package 204 can be heated to bond or attach the base circuit connectors 226 to the base conductors exposed on the component side 228 of the base substrate 104 and to the base device 224 using a reflow or curing process.

The reflow or the curing process also cures the non-deformed conformal interconnects 304 by forming the material in to a fully polymerized resin with electrically conductive, pliable, elastic, and shape conforming characteristics. The temperatures applied to the base package 204 during the reflow or the curing process can result the deformation of the base package 204 including the convex shaped surface of the component side 228.

Figure 9:
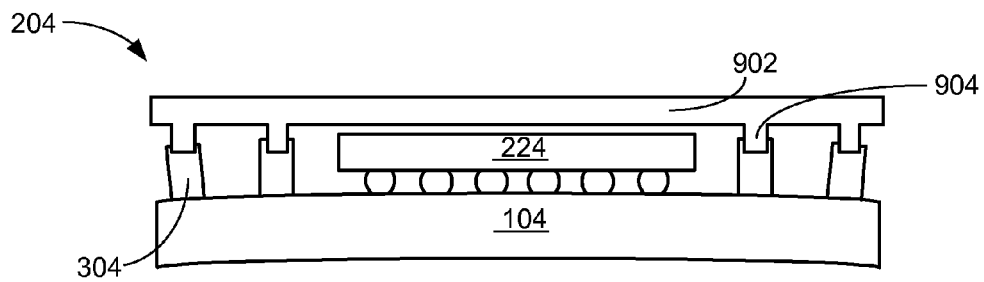
FIG. 9 is the cross-sectional view of FIG. 8 in a testing phase.

Referring now to FIG. 9, therein is shown the cross-sectional view of FIG. 8 in a testing phase. Shown is the base package 204 in a testing phase of manufacture. A test fixture (not shown) with a probe card 902 can be positioned over the base substrate 104 and the base device 224.

Probes 904 of the probe card 902 can be inserted in the non-deformed conformal interconnects 304 to provide electrical connectivity between the circuitry of the base device 224 and the circuitry attached to or within the probe card 902.

It has been discovered that the non-deformed conformal interconnects 304 can improve throughput by minimizing test processing time by eliminating idle down-time. The idle down-time is defined as the time allocated for cleaning and cleaning room processing used to de-contaminate the probes 904 or the probe card 902 before or after testing of the base package 204. The material of the non-deformed conformal interconnects 304 is easily removed or dissolved using organic solvents from the probes 904 or the probe card 902 resulting in minimized or eliminated idle down-time and improved throughput.

It has also been discovered that the base package 204 can be tested and verified as a known good package resulting in improved ship product quality and product reliability.

Figure 10:
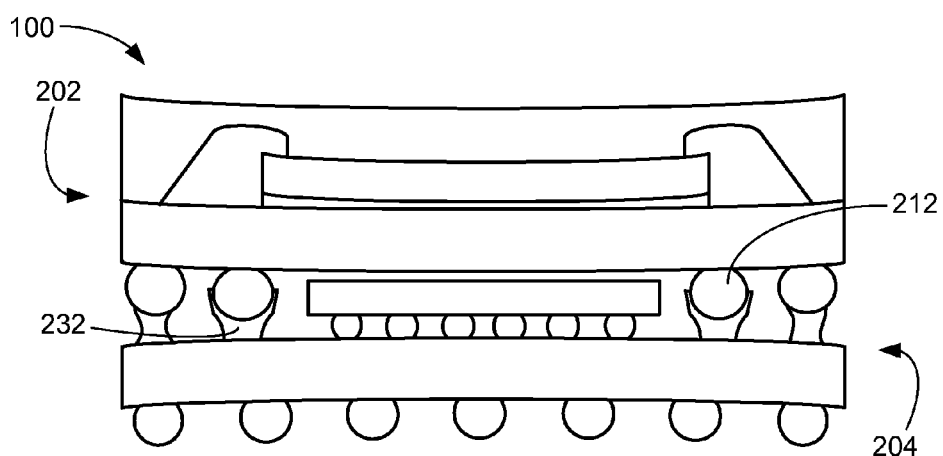
FIG. 10 is a cross-sectional view of FIG. 9 in a package bonding phase.

Referring now to FIG. 10, therein is shown a cross-sectional view of FIG. 9 in a package bonding phase. The probes 904 of FIG. 9 and the probe card 902 of FIG. 9 are separated from the base package 204.

The stack interconnects 212 are aligned over the non-deformed conformal interconnects 304 of FIG. 9. The stack package 202 and the base package 204 are vertically compressed together with the stack interconnects 212 directly on the non-deformed conformal interconnects 304.

An elevated temperature lower than the reflow process or the reflow processing temperatures of the die attach phase is applied to the stack package 202 and the base package 204 combined with vertical compression of the stack package 202 and the base package 204 create a thermal compression bonding process. The thermal compression bonding process results in the formation of the conformal interconnects 232 from the non-deformed conformal interconnects 304 and the integrated circuit packaging system 100 of FIG. 2.

It has been discovered that the conformal interconnects 232 provide a buffer layer at the package interconnection interface. With thermal cycles, polymeric elasticity of the conformal interconnects 232 accommodate variations in vertical direction in the gap between multiple packages. Better reliability performance and solder joint reliability of Package on Package (PoP) package could be achieved as a result of stress reduction from the buffer layer.

It has also been discovered that the conformal interconnects 232 including a fully polymerized resin does not create any further warpage to the integrated circuit packaging system 100 as a result of the absence of any further reflow or curing processing.

It has further been discovered that the base package 204 can be reflowed on to a mother board prior to the thermal compression bonding process of the stack package 202 and the base package 204 while retaining all of the benefits of the present invention.

It has been unexpectedly uncovered that with the conformal interconnects 232, the integrated circuit packaging system 100 is easy to rework even if a defect is found after attaching the stack package 202 to the base package 204 due to characteristics of the fully polymerized resin.

It has been unexpectedly uncovered that the conformal interconnects 232 simplifies any rework processing of the integrated circuit packaging system 100 after the stack package 202 and the base package 204 has been attached or connected together. The polymeric elasticity characteristics of the conformal interconnects 232 permits separation of the stack package 202 from the base package 204 without damage to the stack interconnects 212 or the solder joint of the stack interconnects 212.

Figure 11:
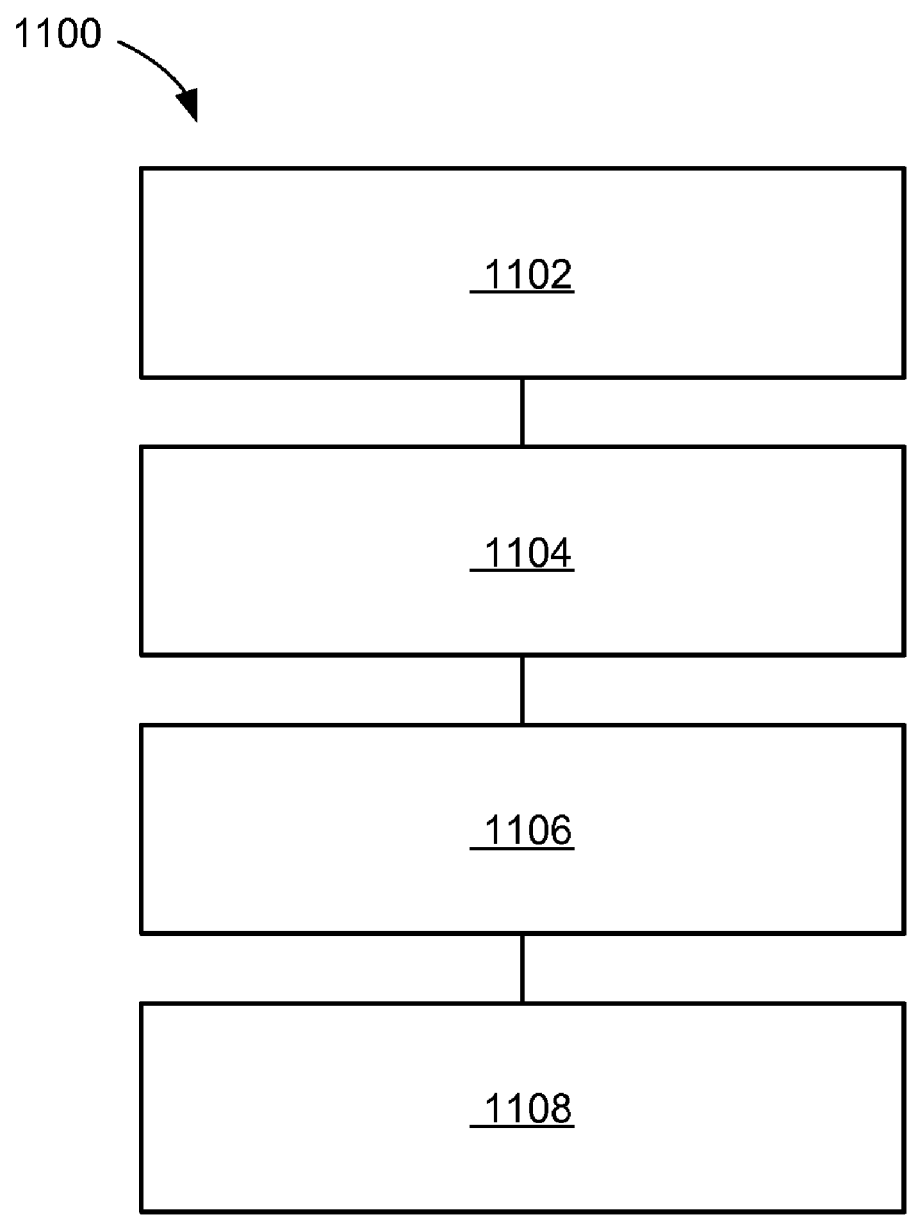
FIG. 11 is a flow chart of a method of manufacture of the integrated circuit packaging system in a further embodiment of the present invention.

Referring now to FIG. 11, therein is shown a flow chart of a method 1100 of manufacture of the integrated circuit packaging system 100 in a further embodiment of the present invention. The method 1100 includes: providing a base substrate having a component side in a block 1102; mounting a base device having a base circuit connector directly on the component side in a block 1104; attaching conformal interconnects, having the same pre-deformation height from the component side, directly on the component side and offset from the base device in a block 1106; and attaching a stack substrate having stack interconnects directly on the conformal interconnects, portions of the stack interconnects covered by the conformal interconnects having different deformation heights from the component side in a block 1108.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a base substrate having a component side;
    mounting a base device having a base circuit connector directly on the component side;
    attaching conformal interconnects, having the same pre-deformation height from the component side, directly on the component side and offset from the base device; and attaching a stack substrate having stack interconnects directly on the conformal interconnects, portions of the stack interconnects covered by the conformal interconnects having different deformation heights from the component side including forming an electrical connection between the stack interconnects and the conformal interconnects by thermal compression having a temperature below reflow.

2. The method as claimed in claim 1 wherein providing the base substrate includes providing the base substrate having the component side with a convex shaped surface.

3. The method as claimed in claim 1 further comprising attaching a system interconnect to a base side of the base substrate opposite the component side.

4. The method as claimed in claim 1 further comprising connecting a stack device to a side of the stack substrate opposite the stack side.

5. The method as claimed in claim 1 wherein attaching the stack interconnects directly on the conformal interconnects includes abutting a surface of the stack interconnects to the component side.

6. A method of manufacture of an integrated circuit packaging system comprising:
providing a base substrate having a component side;
mounting a base device having a base circuit connector directly on the component side;
attaching conformal interconnects, having the same pre-deformation height from the component side, directly on the component side and offset from the base device; and
attaching a stack substrate having a stack side with stack interconnects directly on the conformal interconnects, portions of the stack interconnects covered by the conformal interconnects having different deformation heights from the component side including forming an electrical connection between the stack interconnects and the conformal interconnects by thermal compression having a temperature below reflow.

7. The method as claimed in claim 6 wherein attaching the stack substrate includes attaching the stack substrate having the stack side with a convex shaped surface.

8. The method as claimed in claim 6 further comprising attaching a system interconnect to a concave shaped surface of the base substrate opposite the component side.

9. The method as claimed in claim 6 further comprising connecting a stack device to a concave shaped surface of the stack substrate opposite the stack side.

10. The method as claimed in claim 6 wherein attaching the stack interconnects directly on the conformal interconnects includes abutting a contact surface area of the stack interconnects to the component side.

11. An integrated circuit packaging system comprising:
a base substrate having a component side;
a base device having a base circuit connector mounted directly on the component side;
conformal interconnects attached directly on the component side and offset from the base device; and
a stack substrate having stack interconnects directly on the conformal interconnects, portions of the stack interconnects covered by the conformal interconnects having different deformation heights from the component side, with an electrical connection between the stack interconnects and the conformal interconnects formed by thermal compression having a temperature below reflow.

12. The system as claimed in claim 11 wherein the base substrate includes the base substrate having the component side with a convex shaped surface.

13. The system as claimed in claim 11 further comprising a system interconnect attached to a base side of the base substrate opposite the component side.

14. The system as claimed in claim 11 further comprising a stack device connected to a side of the stack substrate opposite the stack side.

15. The system as claimed in claim 11 wherein the stack interconnects includes a surface of the stack interconnects abutted to the component side.

16. The system as claimed in claim 11 wherein the stack substrate includes a stack side with the stack interconnects.

17. The system as claimed in claim 16 wherein the stack substrate includes the stack substrate having the stack side with a convex shaped surface.

18. The system as claimed in claim 16 further comprising a system interconnect attached to a concave shaped surface of the base substrate opposite the component side.

19. The system as claimed in claim 16 further comprising a stack device connected to a concave shaped surface of the stack substrate opposite the stack side.

20. The system as claimed in claim 16 wherein the stack interconnects includes a contact surface area of the stack interconnects abutted to the component side.

* * * * *